US008384554B1

(12) United States Patent
Curtis (10) Patent No.: US 8,384,554 B1
(45) Date of Patent: Feb. 26, 2013

(54) AUDIBLE CURRENT MONITORING DEVICE (76) Inventor: Kevin M. Curtis, Locust, NC (US)

(*) Notice: Subject to any disclaimer, the term of this patent is extended or adjusted under 35 U.S.C. 154(b) by 347 days.

(21) Appl. No.: 12/683,792

(22) Filed: Jan. 7, 2010

Related U.S. Application Data (60) Provisional application No. 61/204,743, filed on Jan. 9, 2009.

(51) Int. Cl.
G08B 21/00 (2006.01)
(52) U.S. Cl. .......... 340/664; 340/638; 257/529
(58) Field of Classification Search .......... 340/664, 340/638; 257/529
See application file for complete search history.

(56) References Cited

U.S. PATENT DOCUMENTS

| | | | | |
|---|---|---|---|---|
| 3,890,612 A * | 6/1975 | Sweany et al. | ............ | 340/384.6 |
| 3,919,703 A * | 11/1975 | Stevens | ............ | 340/870.09 |
| 5,115,226 A * | 5/1992 | Schweitzer, III | ............ | 340/664 |
| 5,115,371 A * | 5/1992 | Tripodi | ............ | 361/106 |
| 5,510,946 A * | 4/1996 | Franklin | ............ | 361/56 |
| 6,122,157 A * | 9/2000 | Gerlach | ............ | 361/124 |
| 6,262,872 B1 * | 7/2001 | Messerli et al. | ............ | 361/93.2 |
| 6,402,741 B1 | 6/2002 | Keppel et al. | | |
| 6,603,649 B1 * | 8/2003 | Muller et al. | ............ | 361/93.3 |
| 6,825,650 B1 | 11/2004 | McCormack | | |
| 6,894,477 B1 | 5/2005 | Cuplin | | |
| 7,576,304 B2 | 8/2009 | Kraz | | |
| 7,612,654 B2 * | 11/2009 | Bender et al. | ............ | 340/292 |
| 2008/0191550 A1 * | 8/2008 | Parnis | ............ | 307/9.1 |
| 2008/0234957 A1 * | 9/2008 | Banhegyesi et al. | ............ | 702/64 |
| 2009/0061368 A1 * | 3/2009 | Caves et al. | ............ | 431/66 |

* cited by examiner

Primary Examiner — George Bugg
Assistant Examiner — Naomi Small
(74) Attorney, Agent, or Firm — QuickPatents; Kevin Prince (57) ABSTRACT A device and methods for detecting current changes over a preset threshold in a circuit are provided. The device includes a housing for securing at least a circuit board therein. The device further includes at least one alerting device in electrical communication with and controlled by a micro-controller. The device also includes at least one input device fixed with the housing and configured so that a user may set conditions for the micro-controller. The meter also includes at least one detecting device for measuring a current reading in a circuit, and in electrical communication with the micro-controller. The micro-controller stores a current reading in the memory and the micro-controller then compares subsequent current readings to the stored current readings to calculate a current change. If the current change is greater than the preset threshold, the micro-controller activates the at least one alerting device.

15 Claims, 4 Drawing Sheets

AUDIBLE CURRENT MONITORING DEVICE

CROSS-REFERENCE TO RELATED APPLICATIONS

This application claims the benefit of U.S. Provisional Patent Application No. 61/204,743, filed on Jan. 9, 2009, the entire disclosure of which is incorporated herein by reference for all purposes.

STATEMENT REGARDING FEDERALLY SPONSORED RESEARCH AND DEVELOPMENT

Not Applicable.

FIELD OF THE INVENTION

The following description relates to current meters, and more particularly, to a current meter for detecting and alerting an operator of a change in the current in a circuit.

DISCUSSION OF RELATED ART

Monitoring of current flow in a circuit may be performed to detect the presence of malfunctions in the circuit. Electronic circuits generally have three basic malfunctions, a short circuit where the circuit draws more current that it is designed for, an open circuit or the circuit that draws very little or no current, and an intermittent connection in the circuit that causes the circuit current to change when a bad connection is disturbed. Current will continue to flow through the circuit even if one of the loads being powered by the circuit malfunctions. However, the amount of current flowing through the circuit may fluctuate or change due to the malfunctioning load. As such, accurate monitoring of the current flowing through the circuit can reveal the presence of a malfunction. For example, an automotive circuit may be used to power all the exterior lights located at the rear of the automobile, such as the left, right and center brake light, along with the turn signal lights. If the left brake light were to malfunction and subsequently act as an open or shorter load, the amount of current flowing through the automotive circuit will fluctuate or change. Through the use of an accurate current monitor, this current change may be detected, alerting the system to the malfunctioning left brake light.

A device for monitoring current or voltage is described in U.S. Pat. No. 7,576,304 B2 to Kraz on Aug. 19, 2009. The device for monitoring a voltage or current may be applied to sensitive components on a circuit board. The device prevents those sensitive components from being damaged by the voltage or current. The device is an assembly tool that may be held by a user while assembling the circuits on the circuit board. The assembly tool may be, for example, a soldering iron. The device may also monitor the ground connection of the assembly tool. However, the device does not allow a user to input settings, and the device does not allow for a user to work separately from the device because it must be held by the hand of a user. Also, the assembly tool does not provide an option for automatically shutting off power to the cable when a change in current in the cable is determined to be above a preset threshold.

U.S. Pat. No. 6,894,477 B1 to Cuplin et al. on May 17, 2005, describes an electrical current monitor for monitoring a first current within an application. Comprising the electrical current monitor is an amplification circuit, including a first operational amplifier, and a current mirror circuit, including a second operational amplifier. With respect to their power supplies, both operational amplifiers are pseudo-grounded. However, the current monitor does not produce an alert of any kind, nor does allow for a user to input settings. Also, the monitor does not provide an option for automatically shutting off power to a circuit when a change in current in the circuit is determined to be above a preset threshold.

U.S. Pat. No. 6,825,650 B1 to McCormack et al. on Nov. 30, 2004, describes an electrical energy meter that comprises an electrically insulating housing for securing the meter to at least two cables. The housing includes respective electrical contacts for piercing the insulating sheath of each cable, a current probe for measuring current flowing in at least one of the cables, and circuit means for calculating and displaying electrical energy as a function of the voltage across the contacts and the output of the current probe. However, the meter does not allow for a user to input settings. The meter does not produce an alert to a user. Also, the meter does not provide an option for automatically shutting off power to the cable when a change in current in the cable is determined to be above a preset threshold.

U.S. Pat. No. 6,402,741 to Keppel et al. on Jun. 11, 2002, describes an apparatus and method for providing visual and audible indications corresponding to the operational status of an electrosurgical generator so that the visual and audible indications can be readily observed and heard within an area normally associated with a working area of a typical operating room. Facilities are provided to mute the audible indication and to indicate that said audible indication has been muted. The indicators preferably include a visual and audible indication corresponding to the RF current delivered by the electrosurgical generator. However, the apparatus does not allow for a user to input settings. Also, the apparatus does not automatically cut power to a circuit upon detecting a change in current above a preset threshold.

Therefore, there is a need for a device that is hands-free and that stores a current reading of a circuit in the memory, and compares the current reading to previous current readings to calculate a current change. There is also a need for a device that determines the change in current and produces an audible or visual alert to a user. There is also a need for a device that protects the circuit and that may automatically cut the power in the circuit to thereby save the components of the circuit. Furthermore, there is a need for a device that allows a user to generate settings to monitor a circuit. The present invention accomplishes these objectives.

SUMMARY OF THE INVENTION

In one general aspect, provided is a meter for detecting current changes over a preset threshold in a circuit. The meter comprises a housing for securing at least a circuit board therein, the circuit board including a micro-controller in electrical communication with a clock, a power source, and a memory. The meter further comprises at least one alerting device in electrical communication with and controlled by the micro-controller, and at least one input device fixed with the housing and configured so that a user may set conditions for the micro-controller, each input device in electrical communication with the micro-controller. The meter also comprises at least one detecting device in electrical communication with the micro-controller, each detecting device for measuring a current reading in a circuit. When the micro-controller stores a current reading in the memory, the micro-controller then compares a subsequent current readings thereto to calculate a current change, upon which, if the current change is greater than the preset threshold, the micro-controller activates the at least one alerting device.

In some embodiments, the power source may be a battery. The power source may include temporary electrical clips for securing to a power source of the circuit. The memory may include a Random Access Memory (RAM). The at least one alerting device may include an audible transducer, and/or one or more light emitting diodes (LEDs).

The at least one detecting device may include a fuse adapter configured to physically replace a fuse of the circuit, such that the current reading may be taken at the location of the fuse in the circuit. Also, one of the conditions that the user may set for the micro-controller with the at least one input device is the current rating of the fuse, such that upon detection of a current approaching the rating of the fuse the micro-controller may open the circuit with a switch to protect the circuit. The switch may be a micro-controller controlled relay or a micro-controller controlled solid-state switch.

The fuse adapter may further include a fuse socket electrically connected in series with the detecting device and adapted to accept the fuse of the circuit replaced by the fuse adapter, such that if a current in excess of the rating of the fuse occurs in the circuit, faster than the micro-controller can open the switch, the fuse may open to protect the circuit.

The at least one detecting device may include an inductive detector for sensing a current flowing through an electrical conductor fixed proximate therewith. The preset threshold may be, for example, substantially 0.2 amps. In some embodiments, the preset threshold may be set with the at least one input device. The at least one detecting device may include a sensing resister that produces a voltage drop in proportion to the current in the circuit.

In another aspect, provided is a method of detecting a change in current in a circuit. The method includes providing a meter for detecting change in current. The method further includes fixing at least one of the detecting devices to the circuit and taking a current reading, taking a subsequent current reading and comparing same to the previous current reading, and activating the alerting means if the current reading is greater than the preset threshold, otherwise repeating from taking a subsequent current reading.

In another aspect, provided is a method of detecting a change in current in a circuit. The method includes providing a meter for detecting change in current. The method further includes replacing a fuse in the circuit with the fuse adapter, using the at least one input device to set a fuse value for the micro-controller, fixing at least one of the detecting devices to the circuit and taking a current reading, if the current reading is greater than the fuse value, opening the switch and activating the at least one alerting device, otherwise taking a subsequent current reading and comparing same to the previous current reading, and activating the alerting means if the current reading is greater than the preset threshold, otherwise repeating from determining if the current reading is greater than a fuse value.

Described herein is a device that is hands-free and that stores a current reading of a circuit in the memory, and compares the current reading to previous current readings to calculate a current change. The device determines the change in current of a circuit and may produce an audible and/or visual alert to a user. The device protects the circuit and may automatically cut the power in the circuit to thereby prevent the components of the circuit from being damaged. The device also allows a user to generate settings to monitor a circuit. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list. Any use of the word "means" herein is intended to invoke means-plus-function limitation in accordance with 35 U.S.C. §112, sixth paragraph, even if the word "means" follows words describing the function.

The meter described herein provides an efficient method for troubleshooting electronic circuits. Electronic circuits generally have three basic malfunctions, a short circuit where the circuit draws more current that it is designed for, an open circuit or the circuit that draws very little or no current, and an intermittent connection in the circuit that causes the circuit current to change when a bad connection is disturbed. The meter described herein allows a user to determine the state of the circuit and also the change of the circuit condition. A user may troubleshoot the circuit under test without having to actually touch the circuit (i.e. hands-free). A user does not need to carry the meter with him or her because the meter monitors the change in current or the current level of the circuit under test and reports that result to an audible device.

Thus, a user may focus his or her efforts on finding the trouble in the circuit instead of carrying around and manipulating a testing device.

The meter generally comprises a two-part device that consists of a control part including a housing and a detection part for accessing and/or measuring the current in the circuit under test. The two parts are interconnected by wires to facilitate the co-functioning of each.

The control part includes the electrical components that may be use to control the function of the meter. The control part may be mounted inside of a plastic electronics enclosure with wires extending there from for the purpose of connecting to external circuits and for connection to the circuit under test. The electronics may be mounted to a circuit board, for example, a printed circuit board (PCB) that includes the components and hardware that perform the functions of the circuit. The circuit generally may contain some sort of power supply to supply the rest of the components with conditioned power necessary to operate the circuits. The circuit may include an internal power source, such as a dry cell, or an alkaline battery, or the circuit may be powered by an external power source, for example, a car battery. The circuit may be electrically connected to one or more leads that will allow the circuit to receive power from an external power source.

The second part of the detecting device of the meter may be used to access the current in the circuit under test. This detecting device may be electrically placed in series with the circuit under test. In some embodiments, the detecting device may be an inductive type transducer that may non-invasively determine the current in the circuit under test by gauging the strength of the magnetic force that the current in the circuit under test produces. The meter may transform the circuit current into a voltage that may be converted by an analog-to-digital converter to a level that a microcontroller can successfully interpret.

Figure 1:
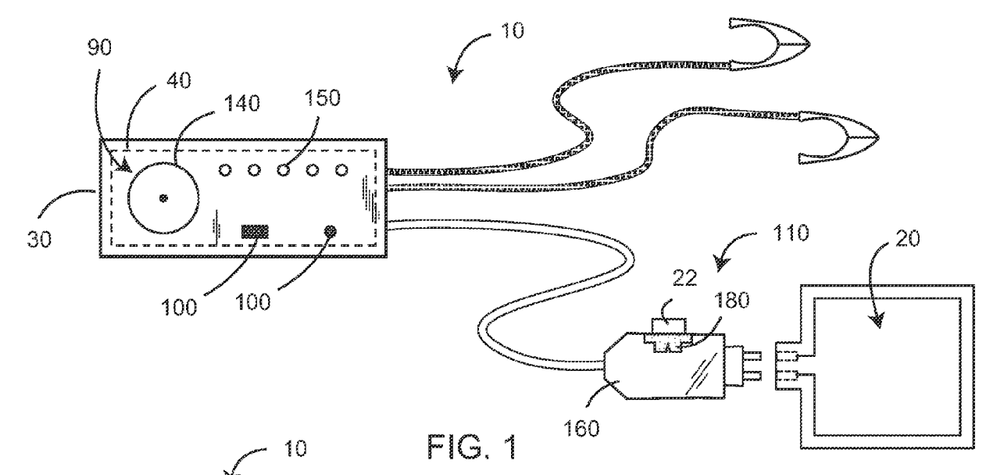
FIG. 1 is diagram illustrating an example of a meter for detecting current changes in a circuit, according to example embodiments.
Figure 2:
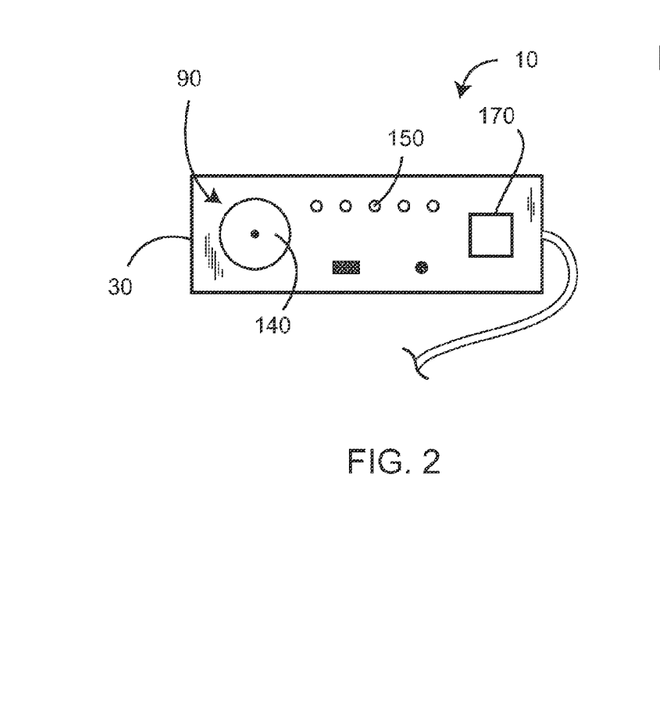
FIG. 2 is a diagram illustrating a second example of a meter for detecting current changes in a circuit, according to example embodiments.
Figure 3:
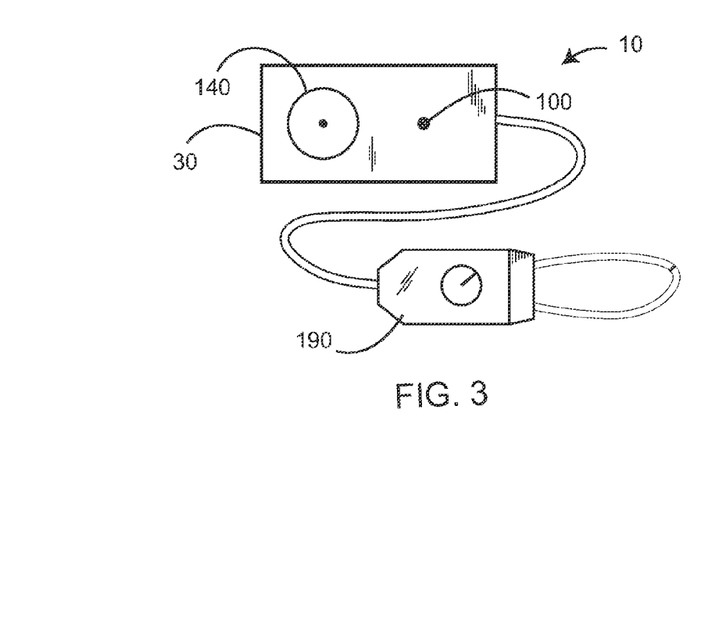
FIG. 3 is a diagram illustrating a third example of a meter for detecting current changes in a circuit, according to example embodiments.

FIGS. 1-3 illustrate examples of a meter for detecting current changes in a circuit. Referring to FIG. 1, example meter 10 is used for detecting current changes in a circuit 20. Housing 30 secures a circuit board 40 within the housing 30. The circuit board includes a micro-controller 50, and at least a clock 60, a power source 70, and a memory 80. The micro-controller will be further discussed with reference to FIG. 4. The circuit board will be further discussed with reference to FIG. 5.

Referring again to FIG. 1, the meter 10 includes at least one alerting device 90 in electrical communication with and controlled by the micro-controller 50. As shown in FIG. 2, the at least one alerting device 90 may be an audible transducer 140, one or more light emitting diodes (LEDs) 150, or a combination thereof. The audible transducer 140 may include a speaker and/or a circular shaped knob, and may allow for the volume of the audible transducer to be adjusted by a user. For example, a user may adjust the volume by turning a knob, for example, a rounded protruding knob. An alert may be sounded, for example, when the meter detects a change in current above the preset threshold. The alert may consist of one or more LEDs 150 that emit light to signify an alert, for example, an array of LEDs 150. The alert may also consist of an alarm sounded by the audible transducer 140.

The meter 10 includes at least one input device 100 fixed with the housing and configured so that a user may set conditions for the micro-controller 50. Each input device 100 is in electrical communication with the micro-controller 50. As illustrated in the example of FIG. 1, the meter 10 includes two input devices 100. The input device 100 may include a switch that is, for example, a pushbutton switch, a slide switch, or the like. The at least one input device 100 enables a user to input commands and program and/or control the meter 10 for detecting current from a circuit 20. For example, a user may use the at least one input devices 100 to set the preset threshold for current.

The meter 10 comprises at least one detecting device 110 in electrical communication with the micro-controller 50. Each detecting device 110 is for measuring a current reading in the circuit 20. Upon detecting the current reading from the circuit 20, the micro-controller 50 stores a current reading in the memory 80, the micro-controller 50 then compares a subsequent current reading to the present current reading to calculate a current change. If the current change is greater than the preset threshold, the micro-controller 50 activates the at least one alerting device 90 to indicate to a user that the detected current is above a preset threshold. The preset threshold may be, for example, 0.1 amps, 0.2 amps, 0.3 amps, 0.5 amps, or other desired amount of current. In some embodiments, the memory 80 may include a random access memory (RAM), The power source 70 of the meter 10 may include temporary electrical clips 130 for securing the meter 10 to a power source of the circuit 20. The temporary electrical clips 130 may include, for example, alligator clips, electrical leads, and the like.

Referring to FIG. 1, the detecting device 110 may include a fuse adapter 22 configured to physically replace a fuse of the circuit 20, such that the current reading may be taken at the location of the fuse in the circuit 20. One of the conditions that the user may set for the micro-controller 50 using the at least one input device 100 is the current rating of the fuse. Referring to FIG. 2, upon detection of a current approaching the rating of the fuse the micro-controller 50 may open the circuit 20 with a switch 170 to protect the circuit 20. In some embodiments, the meter 10 may include a plurality of detecting devices 110.

Referring to FIGS. 1 and 3, the fuse adapter 22 may further include a fuse socket 180 that may be electrically connected in series with the at least one detecting device 110 and adapted to accept the fuse of the circuit 20 replaced by the fuse adapter 22, such that if a current in excess of the rating of the fuse occurs in the circuit 20, faster than the micro-controller 50 can open the switch 170, the fuse may be opened to protect the circuit 20. The at least one detecting device 110 may include an inductive detector 190 for sensing a current flowing through an electrical conductor fixed proximate therewith.

Figure 4:
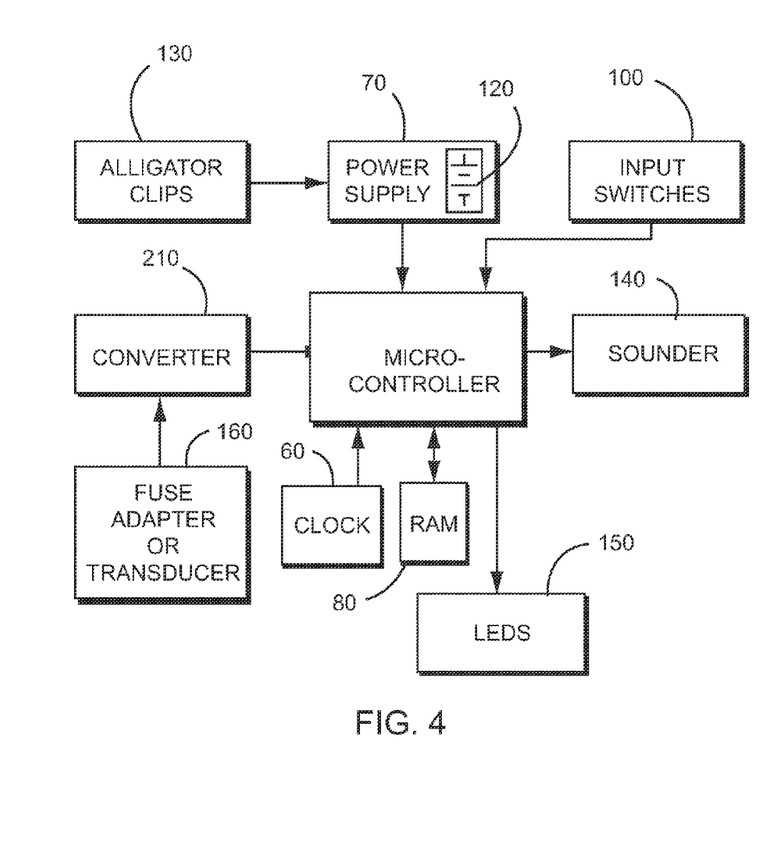
FIG. 4 is a block diagram illustrating an example of a microcontroller in electrical communication with various components, according to example embodiments.

FIG. 4 illustrates an example of a micro-controller in electrical communication with various components. Referring to the example shown in FIG. 4, the micro-controller 50 is in electrical communication with power source 70. Power source 70 may include, for example, a battery 120. The power source may also include temporary electrical clips 130 for securing to a power source of the circuit 20. Micro-controller 50 is in electrical communication with a clock 60, and a memory 80. The memory 80 may include a random access memory (RAM). The micro-controller 50 is also electrically connected to input device 100.

In some embodiments, the micro-controller 50 may be electrically connected to an analog-to-digital converter 210. The analog-to-digital converter 210 may receive current readings from the fuse adapter 160, and convert the analog signal into a digital signal to be used by the meter 10. In some embodiments, the micro-controller 50 may be electrically connected to at least one alerting device 90, for example, an audible transducer 140 and/or one or more LEDs 150.

Figure 5:
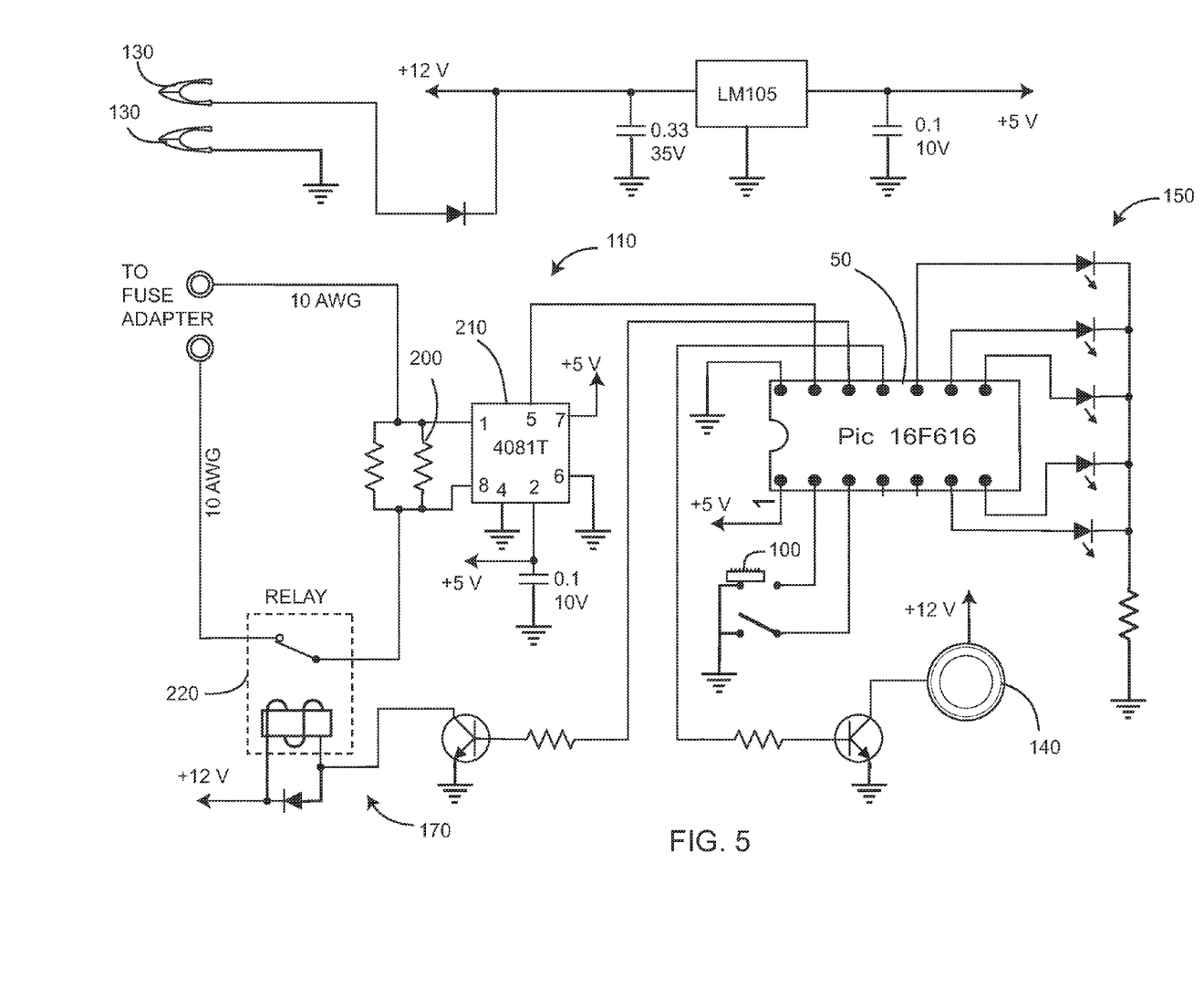
FIG. 5 is a diagram illustrating an example of a circuit included in a circuit board, according to example embodiments.

FIG. 5 illustrates an example of a circuit included in a circuit board. Referring to the example shown in FIG. 5, the micro-controller 50 is represented as a 14 pin 'Pic 16F616' micro-controller. The 14 pin micro-controller is merely illustrated for purposes of example. Any other desired micro-controller may be used with the meter 10. Micro-controller 50 is in electrical communication with the input device 100. The input device 100 may include, for example, a push button, a slide switch, and the like. The micro-controller 50 is also in electrical communication with an array of LEDs 150 and an audible transducer 140. The LEDs 150 and/or the audible transducer 140 may be used to signal an alert to a user, for example, to alert a user that the circuit 20 has a current above a preset threshold.

The power source 70 may include a voltage source, for example, the LM105 voltage regulator shown in FIG. 5. In some embodiments, the power source 70 includes one or more temporary electrical clips 130 for securing to a power source of the circuit 20. The power source is also in electrical communication with the micro-controller 50.

As shown in FIG. 5, the micro-controller 50 is in electrical communication with the detecting device 110. In this example, the detecting device 110 includes a switch 170, a sensing resister 200, an analog-to-digital converter 210, and a relay 220. The sensing resister 200 may produce a voltage drop in proportion to the current in the circuit. The sensing resister 200 may drive an analog-to-digital converter 210 in proportion to the current in the circuit. The detecting device 110 may include a switch 170. In some embodiments, the switch 170 may include a micro-controller controlled relay 220. Upon detection of a current approaching the rating of the fuse the micro-controller 50 may open the circuit with the switch 170 to protect the circuit. In some embodiments, the switch 170 may include a micro-controller controlled solid-state switch 230 (not shown).

Figure 6:
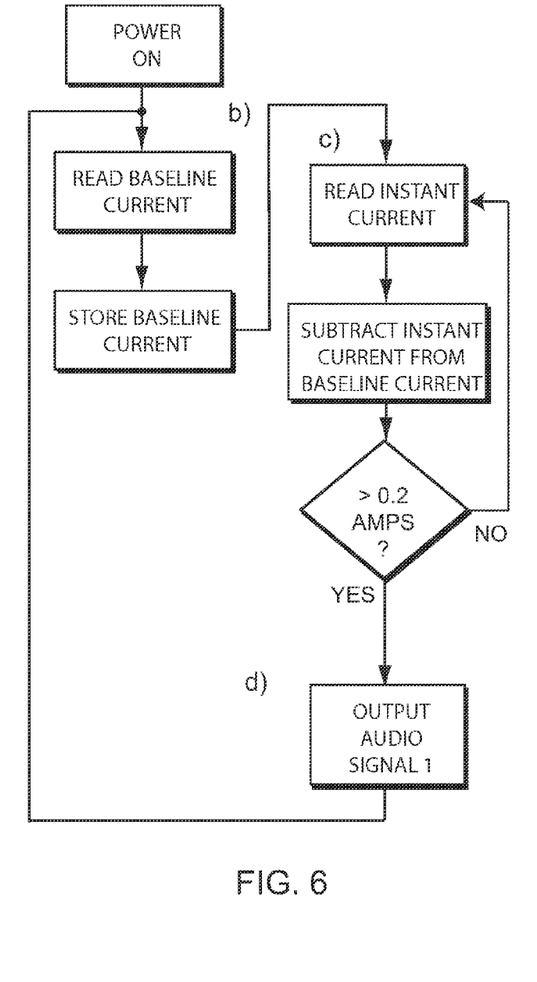
FIG. 6 is a flowchart illustrating an example method of detecting a change in current in a circuit, according to example embodiments.

FIG. 6 illustrates an example method of detecting a change in current in a circuit. Referring to FIG. 1 and FIG. 6, the method of detecting a change in current in a circuit may be performed by the meter 10 described herein. The method may include fixing at least one of the detecting devices 110 to the circuit 20 and taking a current reading. The method may also include taking a subsequent current reading and comparing the subsequent current reading to the previous current reading. If the change in current reading is greater than the preset threshold, the method includes activating an alerting means 90. If the change in current is below a preset threshold the method may end, or the method may continue to take subsequent current readings and compare them to previous current readings. The method may continuously repeat this process, or the method may repeat the process a predetermined number of times. The predetermined number of times may be set by a user one or more input devices 100.

As shown in FIG. 6, in step b) a baseline current of the circuit 20 may be read, and the baseline current may be stored. For example, the meter 10 may be powered on. The meter 10 may be used to read a baseline current and store the current. Next, in step c) the meter 10 may read an instant current and subtract the instant current from the baseline current to determine a change in current. The change in current may be compared to a preset threshold, for example, 0.2 AMPS. If the change in current is above the preset threshold, in step d) an alert may be produced. Otherwise, the meter 10 may take another instant current reading and compare the instant current reading to the baseline current and/or the previous current reading, to determine a second change in current. In step d), if the second change in current is above a preset threshold, an alert may be produced. The method may be repeated any desired amount of times to determine if the difference between a subsequent current reading and a previous current reading exceeds a preset threshold.

Figure 7:
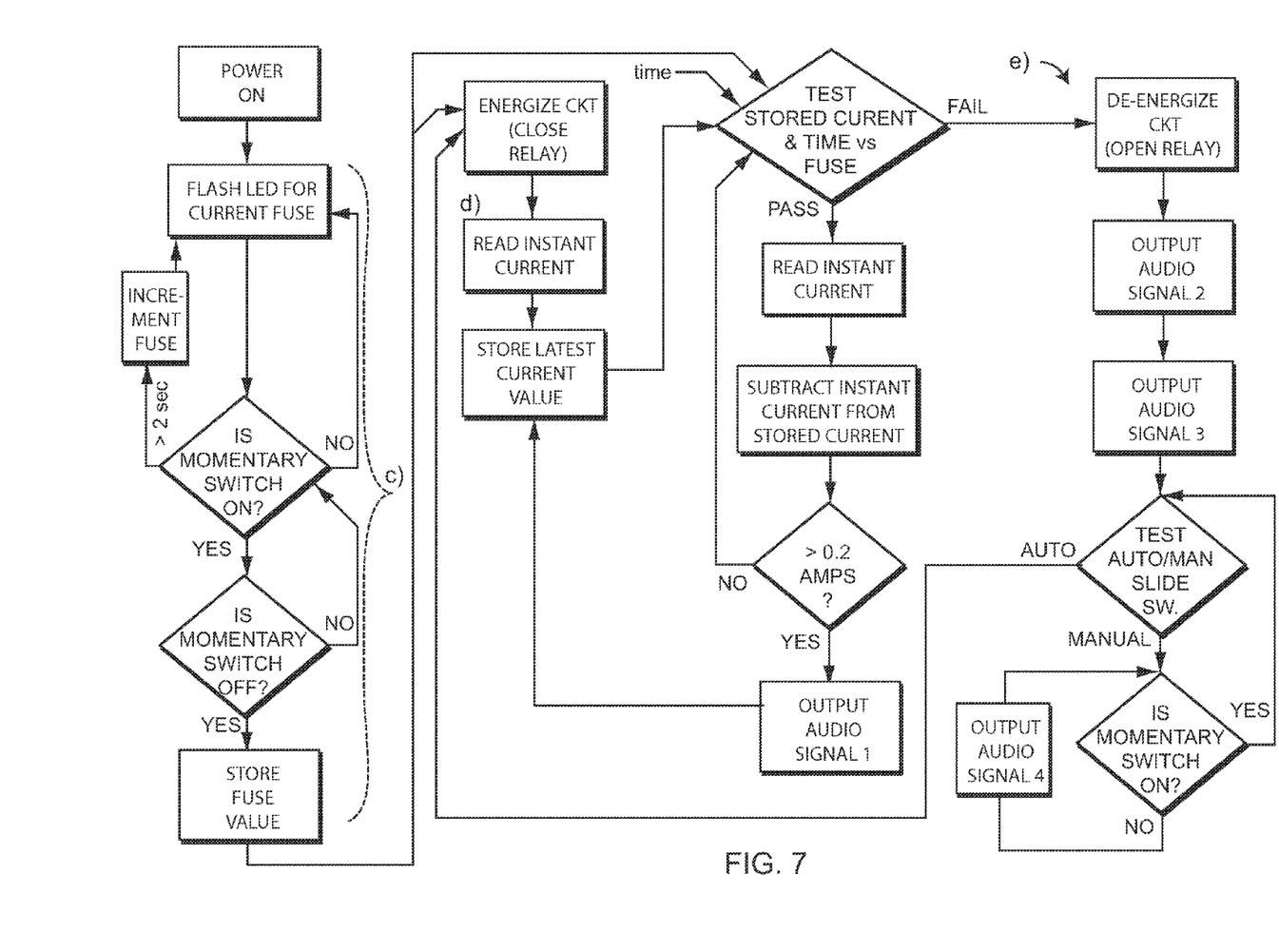
FIG. 7 is a flowchart illustrating another example of a method of detecting a change in current in a circuit, according to example embodiments.

FIG. 7 illustrates another example of a method of detecting a change in current in a circuit. Referring to FIG. 1 and FIG. 7, the method may be performed by the meter 10 described herein. The method may include replacing a fuse in the circuit with the fuse adapter 160. Using the at least one input device 100, a fuse value for the micro-controller 50 may be set. At least one of the detecting devices 110 may be attached to the circuit 20 and may be used to take a current reading of the circuit 20. If the current reading is greater than the fuse value, the method may open the switch 170 and activate the at least one alerting device 90. If the method is less than the fuse value, the method may end, or the method may take a subsequent current reading and comparing the subsequent current reading to the previous current reading. If the current reading is greater than the preset threshold, the method may include producing an alert, otherwise, the method may repeat the steps of taking a subsequent current reading, comparing the subsequent current reading, and determining if the current reading is above a preset threshold. These steps may be repeated any desired amount of times, for example, continuously, or a predetermined amount of times.

For example, as shown in FIG. 7, step c) illustrates an example of turning a switch on and off. Referring to FIG. 7, the meter 10 may flash one or more LEDs to indicate that the switch 170 is on (i.e. to produce an alert). If the switch 170 is not on, the fuse value may be incremented by one, until the momentary switch 170 turns on. Once the switch 170 is off, the fuse value may be stored in the memory 80, and the power to the circuit may be restored. Once the circuit is energized, in step d) the meter 10 may read an instant current value of the circuit 20 and store the current value in memory 80. A determination may then be made as to whether the stored current value is greater than a threshold value of the fuse 22. If the stored current value is less than the threshold value for the fuse, the meter 10 may then read an instant current value and compare the instant current value to the stored current value. If the difference between the instant current value and the stored current value is greater than a preset threshold, the meter may output a first alert. Otherwise, step d) may be repeated.

If in step d), it is determined that the stored current value is greater than the threshold value of the fuse 22, a failure may be determined in step e). The relay of the circuit may be closed to energize the circuit, and an alert may be produced, for example, a second alert, a third alert, or other desired alert. The meter 10 may include an input device 100 that allows a user to set whether the steps of d) and e) are automatically repeated, or whether the steps of d) and e) are repeatedly if a user manually determines to repeat the steps.

The meter describe herein, may protect a circuit under test from an over current situation, while at the same time the meter may save a fuse from being blown or destroyed. The meter may be programmed or constructed so that the meter may immediately open the circuit and alert the user to a short circuit condition if the meter determines that the circuit under test is drawing more current than the current setting allows. The circuit may then allow a predetermined amount of time to pass, and then automatically re-close the circuit and continue monitoring the circuit as normal, or a user may manually close the circuit. In some embodiments, the meter allows the user to program the meter to allow an automatic reset function or to wait for the user's input before resetting the circuit.

The meter described herein is capable of being programmed to automatically open the circuit based upon a sensed over current condition and to automatically close the circuit based upon a user programmable condition or a user input. The meter may provide an audible or visual signal in response to a change in current of the circuit.

The meter may automatically cease current flow in the circuit under test in response to a short circuit condition, for example, using a mechanical type relay, solid-state electronics, and the like. In some embodiments, the meter has the ability to automatically cease current flow in the circuit under test in response to a short circuit condition quickly enough to allow the circuit protection devices to remain intact and unaffected.

The meter may automatically reset to a closed circuit condition following the opening of the circuit due to a short circuit condition. The meter may also include the ability to be manually reset to a closed circuit condition following the opening of the circuit due to a short circuit condition.

The meter may include input devices to allow a user to set the threshold values for the amount of change in the circuit current that will initiate a change in current (i.e. an audible alert). A user may set the threshold values for the amount of current in the circuit that will initiate an open circuit audible alert.

While a particular form of the invention has been illustrated and described, it will be apparent that various modifications can be made without departing from the spirit and scope of the invention. For example, various components may be included in the circuit board of the meter to enhance user functionality. For example, various scales may be used to illustrate a current value or a voltage value to a user. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventor contemplates the various aspects of the invention in any number of claim forms.

Accordingly, the inventor reserves the right to add additional claims after filing the application to pursue such additional claim forms for other aspects of the invention.

What is claimed is:

1. A meter for detecting current changes over a preset threshold in a circuit, the meter comprising:
   a housing for securing at least a circuit board therein, the circuit board including a micro-controller in electrical communication with a clock, a power source, and a memory;
   at least one alerting device in electrical communication with and controlled by the micro-controller;
   at least one input device fixed with the housing and configured so that a user may set conditions for the micro-controller, each input device in electrical communication with the micro-controller; and
   at least one detecting device in electrical communication with the micro-controller, each detecting device for measuring a current reading in a circuit;
   wherein at least one of the detecting devices includes a fuse adapter configured to physically replace a fuse of the circuit, such that the current reading may be taken at the location of the fuse in the circuit, and wherein one of the conditions that the micro-controller can automatically adjust based upon a sensed over current with the at least one input device is the current rating of the fuse;
   whereby when the micro-controller stores a current reading in the memory, the micro-controller then compares a subsequent current readings thereto to calculate a current change, upon which, if the current change is greater than the preset threshold, the micro-controller activates the at least one alerting device, and such that upon detection of a current below the rating of the fuse, the fuse value is incremented until the fuse value is greater than the measured current, whereby the micro-controller stores the fuse value as the threshold amount.

2. The meter of claim 1 wherein the power source is a battery.

3. The meter of claim 1 wherein the power source includes temporary electrical clips for securing to a power source of the circuit.

4. The meter of claim 1 wherein the memory is a Random Access Memory (RAM).

5. The meter of claim 1 wherein at least one of the at least one alerting devices is an audible transducer.

6. The meter of claim 1 wherein at least one of the at least one alerting devices is an LED.

7. The meter of claim 1 wherein at least one of the detecting devices includes a fuse adapter configured to physically replace a fuse of the circuit, such that the current reading may be taken at the location of the fuse in the circuit, and wherein one of the conditions that the user can set for the micro-controller with the at least one input device is the current rating of the fuse, such that upon detection of a current approaching the rating of the fuse the micro-controller can open the circuit with a switch to protect the circuit.

8. The meter of claim 7 wherein the fuse adapter further includes a fuse socket electrically connected in series with the detecting device and adapted to accept the fuse of the circuit replaced by the fuse adapter, such that if a current in excess of the rating of the fuse occurs in the circuit, faster than the micro-controller can open the switch, the fuse may open to protect the circuit.

9. The meter of claim 1 wherein at least one of the detecting devices includes an inductive detector for sensing a current flowing through an electrical conductor fixed proximate therewith.

10. The meter of claim 1 wherein the preset threshold is substantially 0.2 amps.

11. The meter of claim 1 wherein the preset threshold may be set with the at least one input device.

12. The meter of claim 1 wherein the detecting device includes a sensing resister that produces a voltage drop in proportion to the current in the circuit.

13. The meter of claim 9 wherein the switch is a micro-controller controlled relay.

14. The meter of claim 9 wherein the switch is a micro-controller controlled solid-state switch.

15. The meter of claim 1 wherein the at least one input device modifies the increment amount for automatically determining the fuse value.

* * * * *